(12) United States Patent
Ryu et al.

(10) Patent No.: US 12,520,672 B2
(45) Date of Patent: Jan. 6, 2026

(54) DISPLAY DEVICE

(71) Applicant: LG Display Co., Ltd., Seoul (KR)

(72) Inventors: Hoonsang Ryu, Goyang-si (KR); YongHyeon Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 286 days.

(21) Appl. No.: 18/210,545

(22) Filed: Jun. 15, 2023

(65) Prior Publication Data

US 2024/0057397 A1 Feb. 15, 2024

(30) Foreign Application Priority Data

Aug. 12, 2022 (KR) .................... 10-2022-0101359

(51) Int. Cl.
| | |
|---|---|
| *H10K 59/123* | (2023.01) |
| *H10D 86/40* | (2025.01) |
| *H10D 86/60* | (2025.01) |
| *H10K 59/121* | (2023.01) |

(52) U.S. Cl.
CPC ......... *H10K 59/123* (2023.02); *H10D 86/441* (2025.01); *H10D 86/60* (2025.01); *H10K 59/1213* (2023.02)

(58) Field of Classification Search
CPC ............. H10K 59/123; H10K 59/1213; H10K 59/131; H10K 59/805; H10K 59/82; H10K 50/81; H10K 50/82; H10K 50/844; H10K 59/1216; H10D 86/441; H10D 86/60; H10D 86/451; G02F 1/13452
See application file for complete search history.

(56) References Cited

U.S. PATENT DOCUMENTS

| | | | |
|---|---|---|---|
| 6,104,465 | A | 8/2000 | Na et al. |
| RE43,575 | E | 8/2012 | Na et al. |
| 10,476,039 | B2 | 11/2019 | Kim et al. |
| 10,756,157 | B2 | 8/2020 | Hong |
| 2018/0123080 | A1 | 5/2018 | Kim et al. |
| 2019/0206327 | A1 | 7/2019 | Hong |
| 2023/0057191 | A1* | 2/2023 | Kim ................. H10K 59/122 |

FOREIGN PATENT DOCUMENTS

| | | |
|---|---|---|
| KR | 10-0237679 B1 | 1/2000 |
| KR | 10-2018-0046418 A | 5/2018 |
| KR | 10-2019-0081914 A | 7/2019 |

* cited by examiner

*Primary Examiner* — Mohammad A Rahman
(74) *Attorney, Agent, or Firm* — Fenwick & West LLP

(57) ABSTRACT

A display device may include a substrate including a display area comprising subpixels, and a non-display area; a pad part at one side of the non-display area and including data pad electrodes and power voltage pad electrodes; a first line part in the display area and including data lines and power lines; a second line part including, in the non-display area, first connection lines connecting the data pad electrodes and the data lines, and second connection lines connecting the power voltage pad electrodes and the power lines; a third electrode that traverses the second line part and in parallel with one side of the substrate; a planarization layer having a first trench that exposes the third electrode; a second electrode connected to the third electrode through the first trench; and fourth electrodes connecting the third electrode and the power voltage pad electrodes.

20 Claims, 6 Drawing Sheets

DISPLAY DEVICE

CROSS-REFERENCE TO RELATED APPLICATION

This application claims the priority of Republic of Korea Patent Application No. 10-2022-0101359 filed on Aug. 12, 2022, in the Korean Intellectual Property Office, the disclosure of which is hereby incorporated by reference in its entirety.

BACKGROUND

Field

The present specification relates to a display device.

Description of the Related Art

With the development of an information-oriented society, there is an increasing demand for display devices for displaying images. Various types of display devices such as a liquid crystal display device and an organic light-emitting display device are used as the display devices.

As display devices used for a monitor of a computer, a TV set, a mobile phone, and the like, there are an organic light-emitting display (OLED) configured to autonomously emit, and a liquid crystal display (LCD) that requires a separate light source.

In comparison with the liquid crystal display device, the organic or inorganic light-emitting display device uses a light-emitting element, which autonomously emits light, without using a separate light source and has a small thickness and excellent image quality. Therefore, the organic or inorganic light-emitting display devices are mostly applied to thin display applications. In particular, because the light-emitting element may be formed on a flexible substrate, the organic or inorganic light-emitting display device may constitute screens having various shapes by being bent or folded, and thus the organic or inorganic light-emitting display device is suitable for various display device application products.

The light-emitting display device may have light-emitting elements disposed on a subpixel and configured to operate independently. The light-emitting element includes an anode electrode and a cathode electrode, which are opposite to each other, and a light-emitting layer disposed between the anode electrode and the cathode electrode.

The cathode electrode may be provided over the plurality of subpixels. When a power voltage is applied to the cathode electrode to operate the light-emitting element, heat may be concentrated in a region in which a power voltage line and the cathode electrode are connected.

SUMMARY

An object to be achieved by the present disclosure is to provide a display device having a structure capable of decreasing heat generation by reducing density of electric current in a corresponding region by changing an area and shape of a power voltage pad of a display device. Another object to be achieved by the present disclosure is to provide a display device having a structure in which a metal pattern is disposed on a power voltage pad part, and widths of a plurality of power lines are different from one another, such that an area at the periphery of a heat generation region may be increased, and deterioration in reliability may be minimized.

According to an aspect of the present disclosure, a display device includes: a substrate including a display area in which a plurality of subpixels is disposed, and a non-display area disposed at the periphery of the display area; a pad part disposed at one side of the non-display area and including a plurality of data pad electrodes and a plurality of power voltage pad electrodes; a first line part disposed in the display area and including a plurality of data lines and a plurality of power lines; a second line part including, in the non-display area, a plurality of first connection lines connecting the plurality of data pad electrodes and the plurality of data lines, and a plurality of second connection lines connecting the plurality of power voltage pad electrodes and the plurality of power lines; a third electrode configured to traverse the second line part and be parallel with one side of the substrate; a planarization layer having a first trench to expose the third electrode; a second electrode connected to the third electrode through the first trench; and a plurality of fourth electrodes connecting the third electrode and the plurality of power voltage pad electrodes.

According to the embodiment of the present specification, it is possible to minimize deterioration in reliability caused by heat generated from the power voltage pad part of the display device and thus improve reliability of the display device.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
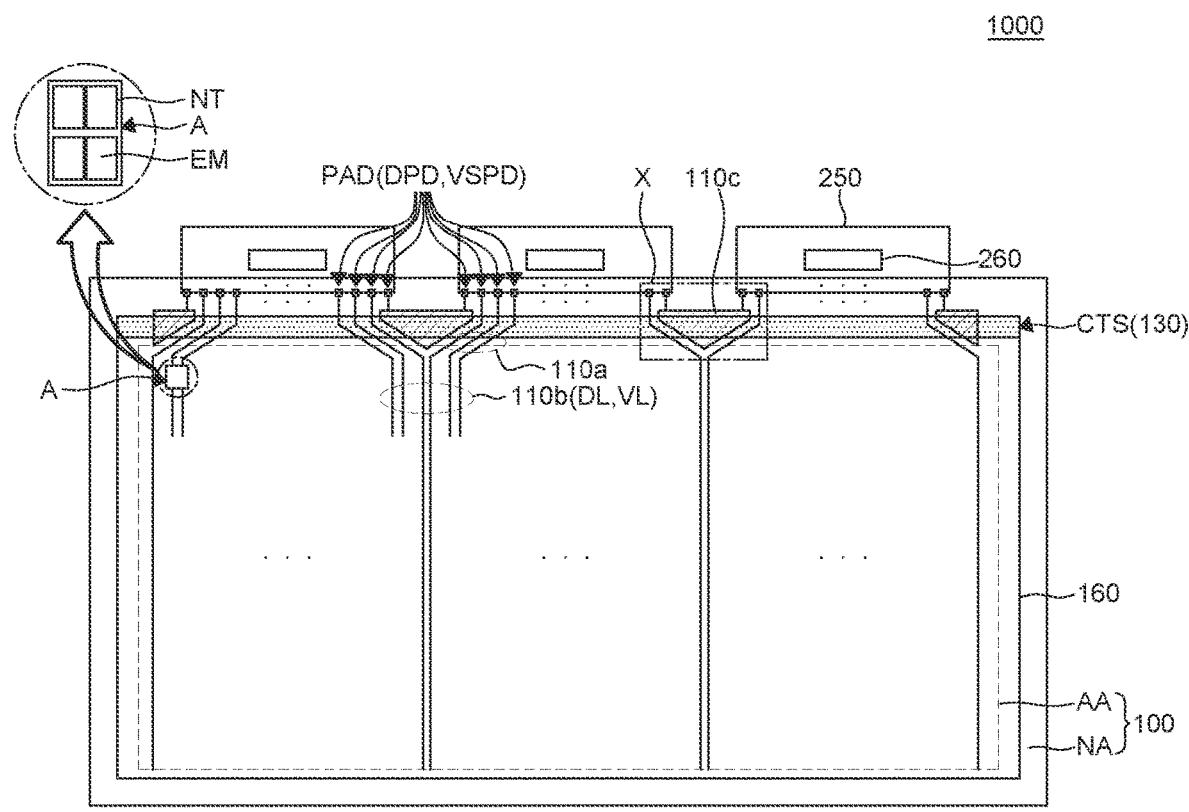
FIG. 1 is a top plan view of a display device according to an embodiment of the present specification.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

In the description of a temporal relationship, for example, when a temporal relationship between two time points is described by using terms "after," "following," "next to," "before," and the like, the two time points may not be continuous when terms "immediately," or "directly" is not used.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

In the present specification, the term "display device" may mean a display device in a narrow sense, such as a liquid crystal module (LCM), an organic light-emitting module (OLED Module), or a quantum dot module, that includes a display panel and a drive unit for operating the display panel. Further, the term "display device" may also mean a set electronic apparatus or a set device (or set apparatus) such as a notebook computer, a television, a computer monitor, an automotive display apparatus, an equipment display apparatus including components for a vehicle, a mobile electronic apparatus such as a smartphone or electronic pad that are finished products (complete products or final products) including the LCM, the OLED module, the QD module, and the like.

Therefore, the display device according to the present specification may mean the display device itself, in a narrow sense, such as the LCM, the OLED module, or the QD module, the application product including the LCM, the OLED module, the QD module, and the like, or a set apparatus that is a final consumer device.

Further, in some instances, the LCM, the OLED module, or the QD module, which includes the display panel and the drive unit, may be expressed as the "display device" in a narrow sense. Further, the electronic apparatus, which is the finished product including the LCM, the OLED module, or the QD module, may be expressed as the "set apparatus" that is distinguished from the display device. For example, the display device in a narrow sense includes the display panel, which is a liquid crystal (LCD) display device, an organic light-emitting (OLED) display device, or a quantum dot display device, and a source PCB that is a control unit for operating the display panel. The set apparatus may include a set PCB that is a set control unit electrically connected to the source PCB and configured to control the entire set apparatus.

The display panel used in the present embodiment may be any form of display panel such as a liquid crystal display panel, an organic light emitting diode (OLED) display panel, a quantum dot (QD) display panel, and an electroluminescent display panel. The display panel of the present embodiment is not limited to a particular display panel including a flexible substrate for an organic electroluminescent (OLED) display panel, and a lower backplate support structure and being capable of being subjected to bezel bending. Further, the shapes or sizes of the display panels used for the display device according to the embodiment of the present specification are not limited.

For example, in case that the display panel is an organic electroluminescent (OLED) display panel, the display panel may include a plurality of gate lines (or a gate line), a plurality of data lines (or a data line), and pixels formed in regions in which the gate lines and the data lines intersect. Further, the display panel may include: an array including thin-film transistors that are elements for selectively applying voltages to the respective pixels; and a sealing substrate or sealing layer (encapsulation) disposed on the array to cover an organic light-emitting element (OLED) layer disposed on the array. The sealing layer may protect the thin-film transistor and the organic light-emitting element layer from external impact and inhibit moisture or oxygen from penetrating into the organic light-emitting element layer. Further, the layer formed on the array may include an inorganic light-emitting layer, for example, a nano-sized material layer or a quantum dot layer.

Hereinafter, embodiments of a display device, which may improve reliability of the display device by minimizing deterioration in reliability caused by heat generated from a power voltage pad part of the display device, will be described in detail.

FIG. 1 is a top plan view of a display device according to an embodiment of the present specification.

With reference to FIG. 1, the display device 1000 according to the embodiment of the present specification may include a substrate 100, a printed circuit film 250, a pad part PAD, a first line part 110b, a second line part 110a, a second electrode 160, a third electrode 130, and a fourth electrode 110c.

The substrate 100 may include a display area (active area) AA in which a plurality of pixels (or subpixels) PXL is disposed, and a non-display area (non-active area or bezel area) NA disposed at the periphery of the display area AA. The substrate 100 may be, but not limited to, a glass substrate or a flexible substrate. For example, the flexible substrate may be any one of a polyimide (PI) substrate, a polyethersulfone (PES) substrate, a polyethylene naphthalate (PEN) substrate, a polyethylene terephthalate (PET) substrate, and a polycarbonate (PC) substrate.

The display area AA may be an area in which the plurality of subpixels PXL is disposed to display an image. The non-display area NA is an area in which no image is displayed. Various lines, various circuits, and the like for operating the light-emitting elements in the display area AA may be disposed in the non-display area NA.

Power voltage, data voltage, and driving voltage may be applied to the respective subpixels PXL so that the plurality of subpixels PXL displays images in the display area AA. The voltage (or signal) may be applied to each of the subpixels PXL in the display area AA from the outside of the display area AA. A starting point at which the voltage is applied may be provided on the non-display area NA or the printed circuit film 250 disposed outside the substrate 100, but the present specification is not limited thereto.

The voltage, which is applied to each of the subpixels PXL in the display area AA from the non-display area NA may be, but not limited to, driving voltage. For example, the driving voltage may be applied to each of the subpixels PXL via the first line part 110b from agate-in-panel (GIP) circuit part. The first line part 110b may include a gate line GL configured to connect the GIP circuit part and each of the subpixels PXL.

The printed circuit film 250 may be disposed outside the substrate 100. The printed circuit film 250 may include a drive integrated circuit (IC) 260 and apply the power voltage and the data voltage to each of the subpixels PXL in the display area AA. For example, the voltage may be applied to each of the subpixels PXL via the pad part PAD, the second line part 110a, and the first line part 110b of the substrate 100 from the drive integrated circuit 260 of the printed circuit film 250.

FIG. 1 illustrates that three printed circuit films 250 are disposed in the display device 1000 according to the embodiment of the present specification, but the present specification is not limited thereto. For example, the number of printed circuit films 250 connected to the substrate 100 may increase or decrease depending on the number of data lines and the number of power lines disposed on the substrate 100.

The pad part PAD may include a power voltage pad electrode VSPD and a data pad electrode DPD. The pad electrode may be electrically connected to the printed circuit film 250 through an anisotropic conductive film (ACF) and connected to the first line part 110b through a connection line included in the second line part 110a. For example, the data voltage, which is supplied through the printed circuit film 250, may be applied to each of the subpixels PXL through a first connection line of the second line part 110a and a data line DL of the first line part 110b via the data pad electrode DPD. For example, the power voltage, which is supplied through the printed circuit film 250, may be applied to each of the subpixels PXL through a second connection line of the second line part 110a and a power line VL of the first line part 110b via the power voltage pad electrode VSPD.

The pad part PAD may be divided into a plurality of sub-pad parts (PADn, n is a natural number equal to or more than two) corresponding to regions in which the printed circuit films 250 are positioned. The plurality of sub-pad parts PADn may be disposed to be spaced apart from one another. With reference to FIG. 1, the number of sub-pad parts of the display device 1000 according to the embodiment of the present specification is, but not limited to, three (n=3).

The plurality of sub-pad parts PADn may be disposed to correspond to the regions in which the plurality of printed circuit films 250 is positioned. The data pad electrodes DPD and the power voltage pad electrodes VSPD may be alternately and densely disposed in each of the sub-pad parts PADn, but the present specification is not limited thereto. For example, an interval between the data pad electrodes DPD may be less than an interval between the data lines DL disposed in the display area AA. The interval between the plurality of sub-pad parts PADn may be greater than a distance between the data pad electrodes DPD.

When the printed circuit film 250 is connected to one side of the substrate 100, an outermost peripheral power voltage pad electrodes VSPD may be disposed at two opposite left and right ends for each of the printed circuit films 250 or two opposite ends of each of the sub-pad parts. The remaining power voltage pad electrodes VSPD and the data pad electrodes DPD may be alternately disposed between the outermost peripheral power voltage pad electrodes VSPD.

The second line part 110a may be disposed in the non-display area NA. The second line part 110a may include the first connection line configured to connect the plurality of data pad electrodes DPD and the data line DL of the first line part 110b, and the second connection line configured to connect the plurality of power voltage pad electrodes VSPD and the power line VL of the first line part 110b.

The first line part 110b may be disposed in the display area AA. The first line part 110b may include a plurality of data lines DL, a plurality of power lines VL, and/or a plurality of gate lines GL.

When the size and arrangement of the respective subpixels PXL are constant, an interval between the power lines VL and an interval between the data lines DL in the first line part 110b may be constant, the interval in the first line part 110b mentioned herein may also be referred as first distance. When the size and arrangement of the printed circuit films 250 are constant, an interval between the power voltage pad electrodes VSPD and an interval between the data pad electrodes DPD in the sub-pad part PADn may be constant, the interval in the sub-pad part PADn mentioned herein may also be referred as second distance. The first distance may depend on a width of the subpixel PXL and an arrangement interval between the subpixels PXL, and the second distance may depend on a width of the sub-pad part PADn and an arrangement interval between the sub-pad parts PADn.

The first distance and the second distance may be different from each other. Typically, the first distance may be greater than the second distance because of a difference in degree of integration between the circuit and the line. For example, a distance between the pad electrodes in the sub-pad part PADn may be less than a distance between the lines in the first line part 110b. Therefore, both the first and second connection lines in the second line part 110a, which connect each of the pad electrodes in the sub-pad part PADn and each of the lines in the first line part 110b, cannot be parallel to each of the lines in the first line part 110b. For example, any one of the first and second connection lines of each of the sub-pad part PADn may be a straight line parallel to any one line in the first line part 110b in a space between the pad part PAD and the first line part 110b, and the remaining connection lines may be curved lines.

The plurality of subpixels PXL, which is disposed in the display area AA and displays images, may each include a driving element and a light-emitting element so that the plurality of subpixels PXL operates independently. The driving element may include at least one thin-film transistor (TFT) and a storage capacitor. The light-emitting element may include, but not limited to, a first electrode (or a pixel electrode), a light-emitting layer, and a second electrode (or a common electrode). With reference to region A in FIG. 1, the subpixels PXL may each be divided into a light-emitting portion (EM) in which the light-emitting elements are disposed, and a non-light-emitting portion (or non-transmissive portion) NT in which a pixel defining film, an opaque line, or the like is disposed.

The plurality of data lines DL may be connected to each of the subpixels PXL to apply image data voltage. The plurality of power lines VL may be connected to each of the subpixels PXL to apply power voltage. The gate line GL may be connected to each of the subpixels PXL to apply driving voltage to operate the element. However, the present specification is not limited thereto. For example, the data line DL and the power line VL extend in a longitudinal direction, and the gate line GL extends in a transverse direction. The data line DL, the power line VL, and the gate line GL are connected to each of the subpixels PXL. The plurality of data lines DL and the plurality of power lines VL may be included in the first line part 110b, but the present specification is not limited thereto.

The power voltage may include pixel power voltage (or driving power source voltage) EVDD, common power voltage (or base power voltage) EVSS, reference voltage Vref, and the like. The pixel power voltage EVDD and the reference voltage Vref may be applied directly to the sub-pixel PXL. For example, the pixel power voltage EVDD may be supplied to the first electrode of the light-emitting element, and the common power voltage EVSS may be supplied to the second electrode 160 of the light-emitting element.

The plurality of power lines VL included in the first line part 110b may be lines configured to supply the pixel power voltage EVDD and the reference voltage Vref to each of the subpixels PXL. The plurality of power lines VL may be connected to the printed circuit film 250 through the second connection line of the second line part 110a and the power voltage pad electrode VSPD of the pad part PAD.

The common power voltage EVSS may be connected to each of the subpixels PXL through the second electrode 160 of the light-emitting element. The second electrode 160 may be provided on the entire surface so as to overlap the display area AA and a partial region of the second line part 110a. For example, the second electrode 160 may at least extend over the entire display area AA and to the outside of the display area AA. The second electrode 160 may be integrated with a region including a first trench T1. The second electrode 160 may be configured as a transparent electrode depending on whether the display device 1000 has a top emission structure or a bottom emission structure.

The common power voltage EVSS may be applied to the second electrode 160 from the printed circuit film 250 via the power voltage pad electrode VSPD of the pad part PAD, the fourth electrode 110c, and the third electrode 130. The fourth electrode 110c may be disposed in the second line part 110a and connected to the third electrode 130 and the second electrode 160 through a connection part CTS.

The connection part CTS is disposed in a partial region in which the second electrode 160 and the second line part 110a overlap each other. The connection part CTS traverses the second line part 110a and is configured to be parallel to one side of the substrate 100. The connection part CTS is configured in the form of a trench made by etching a planarization layer. The third electrode 130 may be disposed over an entire bottom surface of the trench.

The fourth electrode 110c, the third electrode 130, and the second electrode 160 may be sequentially stacked and electrically connected in a region in which the connection part CTS and the fourth electrode 110c intersect. The third electrode 130 and the second electrode 160 may be sequentially stacked and electrically connected in a region other than the region in which the connection part CTS and the fourth electrode 110c intersect.

Figure 2:
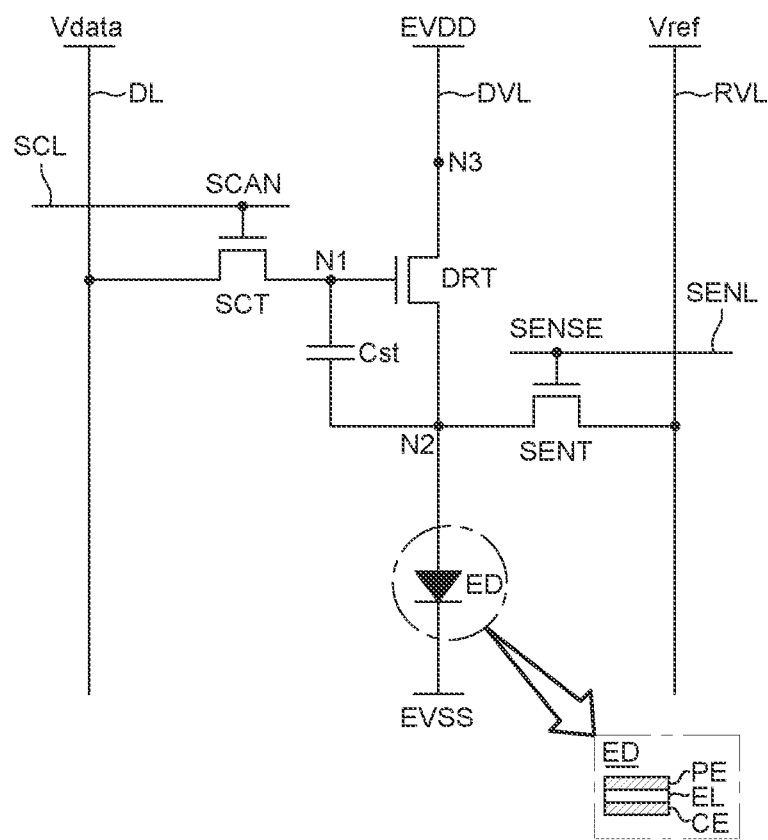
FIG. 2 is an equivalent circuit diagram of a sub-pixel of the display device according to the embodiment of the present specification.

FIG. 2 is an equivalent circuit diagram of a sub-pixel of the display device according to the embodiment of the present specification.

With reference to FIG. 2, the sub-pixels PXL of the display device 1000 according to the embodiment of the present specification may each include a light-emitting element ED, a driving transistor DRT configured to operate the light-emitting element ED while controlling electric current flowing to the light-emitting element ED, a scan transistor SCT configured to transmit a data voltage Vdata to a first node N1 which is a gate node of the driving transistor DRT, and a storage capacitor Cst configured to maintain voltage for a predetermined period.

Each of the sub-pixels PXL may further include a sensing transistor SENT configured to perform an initialization operation, a sensing operation, and the like.

The sub-pixels PXL each have a structure (3T1C structure) having three transistors DRT, SCT, and SENT and one capacitor Cst to operate the light-emitting element ED. However, the number of transistors and the number of capacitors in each of the sub-pixels PXL of the display device 1000 according to the embodiment of the present specification are not limited thereto.

The light-emitting element ED may include a pixel electrode (or an anode electrode or a first electrode) PE, a common electrode (or a cathode electrode or a second electrode) CE (160), and a light-emitting layer EL positioned between the pixel electrode PE and the common electrode CE. The pixel electrode PE of the light-emitting element ED may be an anode electrode or a cathode electrode. The common electrode CE may be a cathode electrode or an anode electrode. The light-emitting element ED may be, but not limited to, an organic light-emitting diode (OLED), an inorganic material-based light-emitting diode (LED), a quantum dot light-emitting element, or the like.

Base voltage EVSS, which corresponds to common voltage, may be applied to the common electrode CE of the light-emitting element ED. For example, the base voltage EVSS may be ground voltage or voltage similar to the ground voltage.

The driving transistor DRT may be a transistor configured to operate the light-emitting element ED and include the first node N1, a second node N2, a third node N3, and the like.

The first node N1 of the driving transistor DRT may be a gate node and electrically connected to a source node or a drain node of the scan transistor SCT. The second node N2 of the driving transistor DRT may be a source node or a drain node and electrically connected to the pixel electrode PE of the light-emitting element ED. The third node N3 of the driving transistor DRT may be a drain node or a source node and electrically connected to a driving voltage line DVL configured to supply the pixel power voltage EVDD.

Hereinafter, for convenience of description, an example will be described in which the second node N2 of the driving transistor DRT is a source node, and the third node N3 of the driving transistor DRT is a drain node. However, the present specification is not limited thereto.

The scan transistor SCT may be connected between the data line DL and the first node N1 of the driving transistor DRT.

The scan transistor SCT may control connection between the first node N1 of the driving transistor DRT and the corresponding data line DL of the plurality of data lines DL in response to a scan signal SCAN supplied from a corresponding scan signal line SCL of a plurality of scan signal lines SCL which is a kind of the gate line GL.

The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the scan signal line SCL, which is a kind of the gate line GL, and receive the scan signal SCAN.

The scan transistor SCT may be turned on by the scan signal SCAN of turn-on level voltage and transmit the data voltage Vdata, which is supplied from the corresponding data line DL, to the first node N1 of the driving transistor DRT.

The scan transistor SCT is turned on by the scan signal SCAN of the turn-on level voltage or turned off by the scan signal SCAN of turn-off level voltage. For example, in case that the scan transistor SCT is an n-type scan transistor, the turn-on level voltage may be high-level voltage, and the turn-off level voltage may be low-level voltage. For example, in case that the scan transistor SCT is a p-type scan transistor, the turn-on level voltage may be low-level voltage, and the turn-off level voltage may be high-level voltage.

The sensing transistor SENT may be connected between the second node N2 of the driving transistor DRT and the reference voltage line RVL.

In response to a sensing signal SENSE supplied from a corresponding sensing signal line SENL of a plurality of sensing signal lines SENL which is a kind of the gate line GL, the sensing transistor SENT may control connection between a corresponding reference voltage line RVL of a plurality of reference voltage lines RVL and the second node N2 of the driving transistor DRT electrically connected to the pixel electrode PE of the light-emitting element ED.

The drain node or the source node of the sensing transistor SENT may be electrically connected to the reference voltage line RVL. The source node or the drain node of the sensing transistor SENT may be electrically connected to the second node N2 of the driving transistor DRT and electrically connected to the pixel electrode PE of the light-emitting element ED. The gate node of the sensing transistor SENT may be electrically connected to the sensing signal line SENL, which is a kind of the gate line GL, and receive the sensing signal SENSE.

The sensing transistor SENT may be turned on and apply the reference voltage Vref, which is supplied from the reference voltage line RVL, to the second node N2 of the driving transistor DRT.

The sensing transistor SENT is turned on by the sensing signal SENSE of the turn-on level voltage or turned off by the sensing signal SENSE of the turn-off level voltage. In this case, in case that the sensing transistor SENT is an n-type sensing transistor, the turn-on level voltage may be high-level voltage, and the turn-off level voltage may be low-level voltage. In case that the sensing transistor SENT is a p-type sensing transistor, the turn-on level voltage may be low-level voltage, and the turn-off level voltage may be high-level voltage.

The storage capacitor Cst may be electrically connected between the first node N1 and the second node N2 of the driving transistor DRT and maintain, for one frame time, the data voltage Vdata corresponding to image signal voltage or voltage corresponding to the data voltage Vdata.

The storage capacitor Cst may be an external capacitor intentionally designed outside the driving transistor DRT instead of a parasitic capacitor that is an internal capacitor existing between the first node N1 and the second node N2 of the driving transistor DRT.

The driving transistor DRT, the scan transistor SCT, and the sensing transistor SENT may each be an n-type transistor or a p-type transistor. All the driving transistor DRT, the scan transistor SCT, and the sensing transistor SENT may be n-type transistors or p-type transistors. At least one of the driving transistor DRT, the scan transistor SCT, and the sensing transistor SENT may be an n-type transistor (or a p-type transistor), and the remaining transistors may be p-type transistors (or n-type transistors).

The scan signal line SCL and the sensing signal line SENL may be different gate lines GL. In this case, the scan signal SCAN and the sensing signal SENSE may be different separate gate signals. In the single sub-pixel PXL, an on-off timing of the scan transistor SCT may be independent of an on-off timing of the sensing transistor SENT. For example, in the single sub-pixel PXL, the on-off timing of the scan transistor SCT may be identical to or different from the on-off timing of the sensing transistor SENT.

Alternatively, the scan signal line SCL and the sensing signal line SENL may be identical gate lines GL. For example, in the single sub-pixel PXL, the gate node of the scan transistor SCT and the gate node of the sensing transistor SENT may be connected to the single gate line GL. In this case, the scan signal SCAN and the sensing signal SENSE may be identical gate signals. In the single sub-pixel PXL, the on-off timing of the scan transistor SCT may be identical to the on-off timing of the sensing transistor SENT.

The reference voltage line RVL may be disposed for each sub-pixels row. Alternatively, the reference voltage line RVL may be disposed for two or more sub-pixels row. In case that the reference voltage line RVL is disposed for two or more sub-pixel rows, the plurality of sub-pixels PXL may receive the reference voltage Vref from the single reference voltage line RVL. For example, the reference voltage lines RVL may be disposed, one reference voltage line RVL for four sub-pixel rows. For example, the single reference voltage line RVL may be shared by the sub-pixels PXL included in the four sub-pixel rows.

The driving voltage line DVL may be disposed for each sub-pixel row. Alternatively, the driving voltage line DVL may be disposed for two or more sub-pixel rows. In case that the driving voltage line DVL is disposed for two or more sub-pixel rows, the plurality of sub-pixels PXL may receive the driving power voltage EVDD from the single driving voltage line DVL. For example, the driving voltage lines DVL may be disposed, one driving voltage lines DVL for four sub-pixel rows. For example, the single driving voltage line DVL may be shared by the sub-pixels PXL included in the four sub-pixel rows.

The 3T1C structure of the sub-pixel PXL illustrated in FIG. 2 is an illustrative example. The sub-pixel PXL may further include one or more transistors or one or more capacitors in some instances. In addition, the plurality of sub-pixels may each have the identical structure. Some of the plurality of sub-pixels PXL may have different structures.

The display device 1000 according to the embodiment of the present specification may have, but not limited to, a top emission structure or a bottom emission structure.

Figure 3:
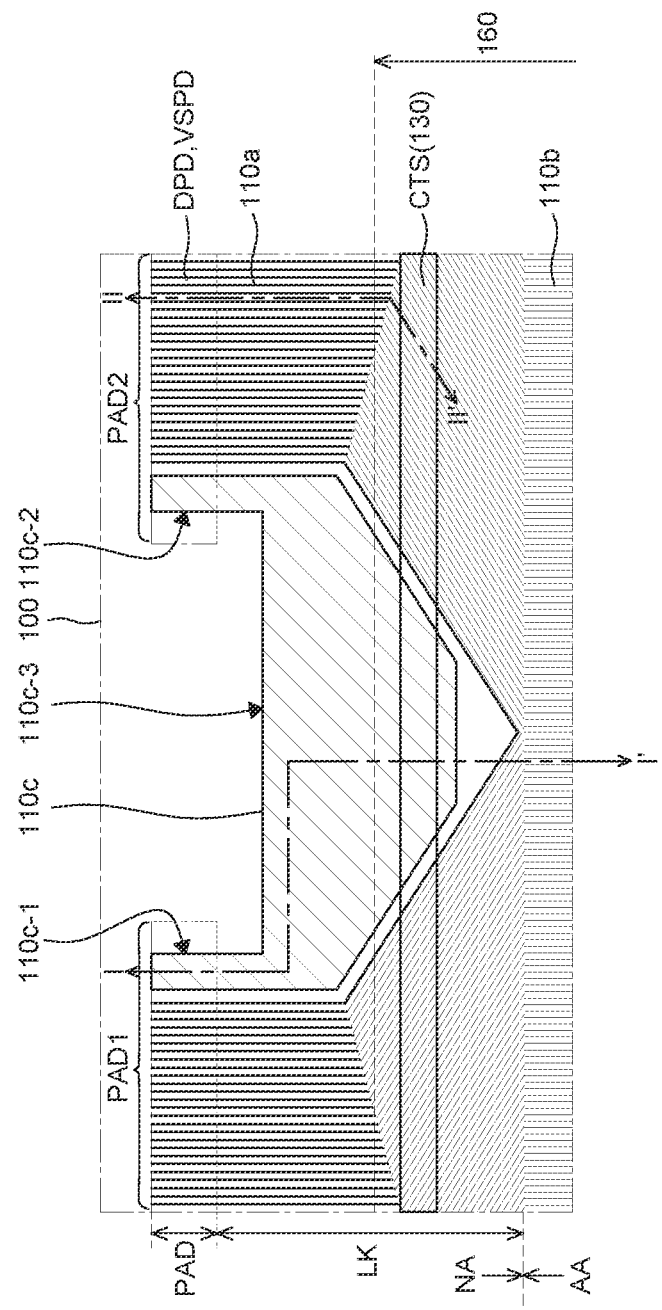
FIG. 3 is an enlarged view of region X in FIG. 1 according to an embodiment of the present specification.

FIG. 3 is an enlarged view of region X in FIG. 1 according to one embodiment.

With reference to FIG. 3, region X may include a region of the second line part 110a between the adjacent printed circuit films 250, a region of the pad part PAD, and a partial region of the first line part 110b. FIG. 3 illustrates a configuration of the substrate 100 before the printed circuit film 250 is connected to the pad part PAD. The pad part PAD is a portion connected to the printed circuit film 250. In the display device 1000, the pad part PAD may be covered by the printed circuit film 250.

The pad part PAD may be divided into the plurality of sub-pad parts (PADn, n is a natural number equal to or more than two) corresponding to the regions in which the printed circuit films 250 are positioned. The plurality of sub-pad parts PADn may be disposed to be spaced apart from one another. With reference to FIGS. 1 and 3, the number of sub-pad parts of the display device 1000 according to the embodiment of the present specification is, but not limited to, three (n=3).

The plurality of sub-pad parts PADn may be disposed to correspond to the regions in which the plurality of printed circuit films 250 is positioned. The data pad electrodes DPD and the power voltage pad electrodes VSPD may be alternately and densely disposed in each of the sub-pad parts PADn, but the present specification is not limited thereto. For example, the interval between the data pad electrodes DPD may be smaller than the interval between the data lines DL disposed in the display area AA.

The fourth electrode 110*c* may be disposed in a space between the sub-pad parts PADn and a space LK in which the second line part 110*a* is not provided between the pad part PAD and the first line part 110*b*. The fourth electrode 110*c* may include a body portion 110*c*-3 disposed in the second line part 110*a*, a first protruding portion 110*c*-1 disposed at one side of the body portion 110*c*-3 and protruding in a direction of the pad part PAD, and a second protruding portion 110*c*-2 disposed at the other side, which is different from one side of the body portion 110*c*-3, and protruding in the direction of the pad part PAD.

A width of the body portion 110*c*-3 may decrease in a direction from the non-display area NA to the display area AA. The body portion 110*c*-3 may have, but not limited to, a shape corresponding to a triangular or pentagonal shape. For example, the fourth electrode 110*c* may be disposed between the first or second connection line at the right side corresponding to a first sub-pad part PAD1 and the first or second connection line at the left side corresponding to a second sub-pad part PAD2. The fourth electrode 110*c* may have a triangular or pentagonal shape and be narrowed from above to below.

The first protruding portion 110*c*-1 and the second protruding portion 110*c*-2 may protrude in a direction from an outer peripheral line of the body portion to the pad part PAD. The first protruding portion 110*c*-1 and the second protruding portion 110*c*-2 may be configured to be symmetric with respect to each other. The first protruding portion 110*c*-1 and the second protruding portion 110*c*-2 may each define the outermost peripheral power voltage pad electrode VSPD of the sub-pad part PADn. For example, the first protruding portion 110*c*-1 may be the outermost peripheral power voltage pad electrode VSPD included in the first sub-pad part PAD1, and the second protruding portion 110*c*-2 may be the outermost peripheral power voltage pad electrode VSPD included in the second sub-pad part PAD2. A width of the outermost peripheral power voltage pad electrode VSPD may be larger than a width of the remaining power voltage pad electrode VSPD.

A shape of the fourth electrode 110*c* may be modified within a range in which a region occupied by the first connection line of the second line part 110*a* for connecting the data pad electrode DPD and the data line DL is not increased.

The fourth electrode 110*c* may serve as the power voltage pad electrode VSPD of the pad part PAD, which transmits the common power voltage EVSS from the printed circuit film 250 to the second electrode 160 and serve as the second connection line of the second line part 110*a*. The common power voltage EVSS of the fourth electrode 110*c* may be transmitted to the second electrode 160 via the third electrode 130. For example, the fourth electrode 110*c* may be connected to the third electrode 130 and the second electrode 160 through the connection part CTS.

The connection part CTS is disposed in a partial region in which the second electrode 160 and the second line part 110*a* overlap each other. The connection part CTS traverses the second line part 110*a* and is configured to be parallel to one side of the substrate 100. The connection part CTS is configured in the form of a trench made by etching a planarization layer. The third electrode 130 may be disposed over an entire bottom surface of the trench.

The fourth electrode 110*c*, the third electrode 130, and the second electrode 160 may be sequentially stacked and electrically connected in a region in which the connection part CTS and the fourth electrode 110*c* intersect. The third electrode 130 and the second electrode 160 may be sequentially stacked and electrically connected in a region other than the region in which the connection part CTS and the fourth electrode 110*c* intersect.

Figure 4:
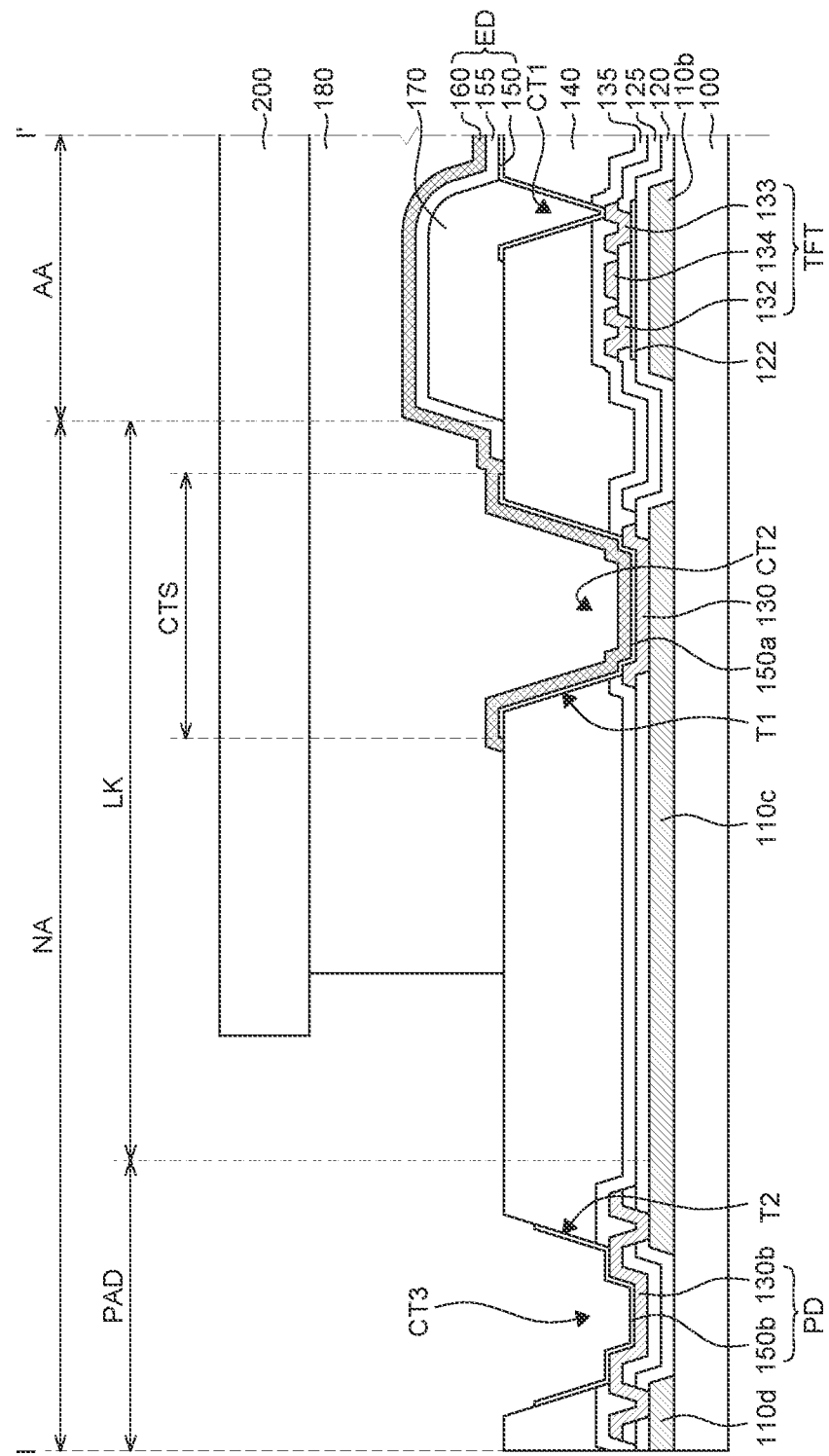
FIG. 4 is a cross-sectional view taken along cutting line I-I' in FIG. 3 according to an embodiment of the present specification.
Figure 5:
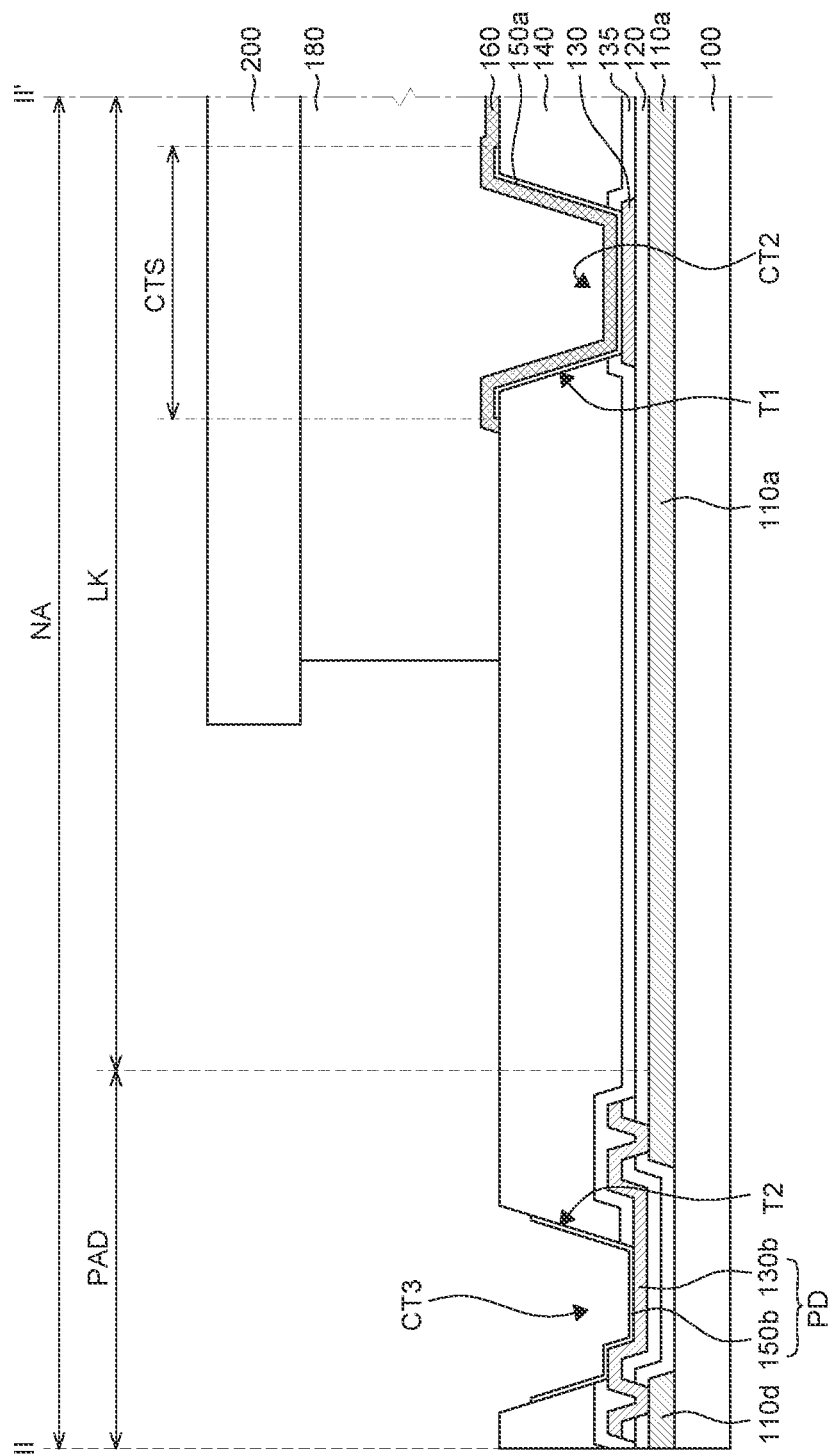
FIG. 5 is a cross-sectional view taken along cutting line II-II' in FIG. 3 according to an embodiment of the present specification.

FIG. 4 is a cross-sectional view taken along cutting line I-I' in FIG. 3 according to one embodiment, and FIG. 5 is a cross-sectional view taken along cutting line II-II' in FIG. 3 according to one embodiment.

With reference to FIGS. 1 and 3 to 5, in the display device 1000 according to the embodiment of the present specification, a buffer layer 120, an interlayer insulation layer 125, a protective layer 135, a planarization layer 140, and an opposing substrate 200 may be sequentially provided on the substrate 100. The display area AA may include the driving element and the light-emitting element of the subpixel PXL, and the first line part 110*b*. The non-display area NA may include a pad electrode 130*b*, the second line part 110*a*, the fourth electrode 110*c*, the third electrode 130, the connection part CTS, and the first trench T1.

The subpixels PXL may each include the driving element and the light-emitting element so that the subpixels PXL operate independently. The driving element may include at least one thin-film transistor TFT and a storage capacitor. The light-emitting element ED may include a first electrode (or an anode electrode or a pixel electrode) 150, a light-emitting layer 155, and a second electrode (or a cathode electrode or a common electrode) 160.

The thin-film transistor TFT may include a semiconductor layer 122, a gate electrode 134 configured to overlap a channel of the semiconductor layer 122, and a source electrode 132 and a drain electrode 133 connected to two opposite sides of the semiconductor layer 122. The drain electrode 133 of the thin-film transistor TFT may be connected to the first electrode 150 of the light-emitting element ED, but the present specification is not limited thereto.

The semiconductor layer 122 may include at least any one of polysilicon, amorphous silicon, and oxide semiconductor. In some instances, semiconductor layers having different properties may be used.

The thin-film transistor TFT according to the embodiment of the present specification may have, but not limited to, a top-gate structure. For example, the thin-film transistor TFT may be modified to have a bottom-gate structure. Alternatively, the gate electrodes may be provided on both upper and lower portions of the semiconductor layer 122. For example, in case that the thin-film transistor TFT provided in the subpixel PXL is provided as a plurality of thin-film transistors TFT, the thin-film transistors TFT may have different shapes.

The gate electrode 134, the source electrode 132, and the drain electrode 133 of the thin-film transistor TFT may be provided in the same layer, but the present specification is not limited thereto. For example, the gate electrode 134, the source electrode 132, and the drain electrode 133 may be provided on different layers as an interlayer insulation layer is interposed on a lower portion of any one of the gate electrode 134, the source electrode 132, and the drain electrode 133.

The light-emitting element ED may be configured by stacking the first electrode 150, the light-emitting layer 155, and the second electrode 160 on the planarization layer 140. Based on a light-emitting direction, any one of the first electrode 150 and the second electrode 160 may be a transparent electrode made of ITO, IZO, ITZO, or the like, the other of the first electrode 150 and the second electrode 160 may be a reflective electrode made of aluminum (Al), silver (Ag), an Ag—Mg alloy, or other reflective materials. However, the present specification is not limited thereto. For example, in case that the display device 1000 is a transparent display device, both the first electrode 150 and the second electrode 160 may be transparent electrodes. Alternatively, the first electrode 150 correspond to a transmissive portion may be excluded, and the second electrode 160 may remain as an electrode having transparent characteristics or reflective and transmissive characteristics.

A bank 170 is provided on the planarization layer 140 so that a light-emitting portion EM of each of the subpixels PXL is exposed. In the display area AA, the bank 170 may be configured to partially overlap an edge of the first electrode 150.

The light-emitting layer 155 and the second electrode 160 may be provided on the first electrode 150 and constitute the light-emitting element ED.

The light-emitting layer 155 may include a hole injection layer, a hole transport layer, an organic light-emitting layer, an electron transport layer, and an electron injection layer. Among the layers, the organic light-emitting layer may be formed for each subpixel by using a fine metal mask so as to correspond to the light-emitting portion EM. Except for the organic light-emitting layer, the remaining layers and the common layers, such as the hole injection layer, the hole transport layer, the electron transport layer, and the electron injection layer, may be formed by using a common mask so as to at least correspond to the entire display area AA without finely separating the layers for each subpixel.

According to another embodiment of the present specification, in case that the light-emitting layer 155 is provided as a plurality of stacked organic light-emitting layers, the organic light-emitting layers may be separated and provided in a plurality of stacks together with the other common layers, and the plurality of stacks may be partitioned by charge generating layers. However, the present specification is not limited thereto. For example, the plurality of stacked organic light-emitting layers may be integrated together with the other common layers so as to correspond to the entire display area AA.

An upper portion of the light-emitting element ED may further include a protective layer or a capping layer. For example, a sealing part may be provided on the second electrode 160, and the first trench T1 is filled with the sealing part. The region in which the sealing part is provided may include the entire display area AA and a part of the non-display area NA. One side of the sealing part may be disposed up to an upper portion of the planarization layer 140 disposed outside the first trench T1.

The plurality of subpixels PXL may be disposed in the display area AA of the substrate 100. The subpixels PXL may each include the light-emitting portion EM. The region of the light-emitting portion EM may be defined in an open region of the bank 170. The region, which excludes the light-emitting portion EM, may be defined as a non-light-emitting portion or a non-transmissive portion NT.

The first trench T1 provided in the planarization layer 140 is identical in shape to the connection part CTS. The first trench T1 may have a shape corresponding to the third electrode 130 and parallel to one side of the substrate 100. The first trench T1 has a uniform width and is disposed at an outer periphery of the display area AA of the substrate 100, such that moisture or air, which penetrates into the substrate 100 from the outside of the substrate 100, may be blocked by the first trench T1.

The planarization layer 140 may compensate for a level difference of an array provided at the lower side. The planarization layer 140 may be made of a material capable of planarizing a top surface of the planarization layer 140 so that the top surface of the planarization layer 140 has a uniformly flat surface. For example, the planarization layer 140 may be made of an organic insulating material, but the present specification is not limited thereto.

The organic material may be relatively vulnerable to permeating moisture. However, the planarization layer 140 of the display device 1000 according to the embodiment of the present specification may be provided to be planar and distinguished by the first trench T1 disposed at one side of the non-display area NA and provided along one side of the substrate 100. For example, the planarization layer 140 disposed in the non-display area NA and the planarization layer 140 disposed in the display area AA may be distinguished by the first trench T1. Therefore, it is possible to reduce or inhibit an influence of permeating moisture or the like, which is applied to the planarization layer 140 disposed in the non-display area NA, to the planarization layer 140 disposed in the display area AA. Therefore, it is possible to improve reliability related to the moisture permeation due to the planarization layer 140.

A length of the first trench T1 may be equal to a horizontal distance between the data lines DL or the power lines VL disposed in the display area AA and provided at the outermost left and right sides. The third electrode 130 disposed in the first trench T1 has a line shape having a predetermined width that traverses the second line part 110a. The third electrode 130 may be connected to the second electrode 160 in the first trench T1. With the above-mentioned structure, electric current flowing from the second electrode 160 may smoothly flow to the printed circuit film 250 through the fourth electrode 110c, which makes it possible to inhibit concentration of density of electric current. For example, it is possible to provide the display device capable of inhibiting concentration of heat in a local region.

The power voltage may be supplied to the second electrode 160 through the connection part CTS formed in a linear shape or a line shape along a horizontal side of the display area AA. For example, the power voltage may be uniformly supplied vertically from the linear connection part CTS without being biased toward a local region. Therefore, it is possible to supply electric current with uniform density to all the subpixels PXL provided in the display area AA of the substrate 100.

In the display device 1000 according to the embodiment of the present specification, the third electrode 130 and the second electrode 160 are connected in a space LK between the display area AA and the pad part PAD on which the fourth electrode 110c is disposed. Therefore, it is possible to reduce the bezel or the non-display area NA and maximize the effective area of the substrate 100 without requiring a separate connection line.

The fourth electrode 110c may be connected to the power voltage pad electrode VSPD and directly receive power voltage. The power voltage may be power voltage to be applied to the second electrode 160. The power voltage may be ground voltage or predetermined voltage having a (+) or (−) value. The voltage to be applied to the second electrode 160 is also called base power voltage or EVSS voltage so as to be distinguished from driving power voltage (or EVDD voltage) to be supplied to the driving transistor DRT connected to the light-emitting element ED in each of the subpixels PXL. The driving power voltage may have a higher value than the base power voltage, but the present specification is not limited thereto.

The power voltage, which is supplied to the third electrode 130 through the fourth electrode 110c, is uniformly supplied to the second electrode 160 extending to at least cover the entire display area AA and the third electrode 130 in the non-display area NA. For example, the connection part CTS, to which the second electrode 160 and the third electrode 130 are connected, is formed in a linear shape along one side of the display area AA of the substrate 100. Therefore, uniform power voltage may be supplied in the vertical direction from the connection part CTS.

The data pad electrode DPD and the power voltage pad electrode VSPD may have two or more layers. For example, the pad PD may include: the pad electrode 130b disposed in the same layer as at least one electrode that constitutes the thin-film transistor TFT; and a second upper metal layer 150b disposed in the same layer as the first electrode 150 of the light-emitting element ED. The power voltage pad electrode VSPD may be electrically connected to or integrated with the first protruding portion 110c-1 or the second protruding portion 110c-2 of the fourth electrode 110c.

The buffer layer 120 may be interposed between the third electrode 130 and the second line part 110a, and the third electrode 130 and the fourth electrode 110c may be electrically connected.

The third electrode 130 may be positioned in the same layer as at least one electrode of the thin-film transistor TFT. In the connection part CTS, the third electrode 130 is connected to the fourth electrode 110c positioned on the second line part 110a and receives power voltage. For example, the third electrode 130 may be connected to the body portion 110c-3 of each of the plurality of fourth electrodes 110c. The fourth electrode 110c and the first and second connection lines of the second line part 110a may be disposed in the same layer as shield metal that covers a lower side of the semiconductor layer 122. The shield metal may serve as the data line DL or the power line VL. The pad electrode 130b having the power voltage pad electrode VSPD and the data pad electrode DPD may be connected to a third metal layer 110d at the periphery thereof.

The data line DL and the power line VL of the first line part 110b, the first and second connection lines of the second line part 110a, the fourth electrode 110c, and the third metal layer 110d may include, but not limited to, metal such as copper, molybdenum, aluminum, chromium, and titanium that have high conductivity. For example, the data line DL and the power line VL of the first line part 110b, the first and second connection lines of the second line part 110a, the fourth electrode 110c, and the third metal layer 110d may be modified to be made of another material capable of supplying the power voltage and the data voltage and maintaining uniform conductivity over the entire region of the substrate 100. For example, the data line DL and the power line VL of the first line part 110b, the first and second connection lines of the second line part 110a, the fourth electrode 110c, and the third metal layer 110d may be metal layers disposed at the lowermost side of the substrate 100 and also include metal or other materials that have resistance against impurities introduced from the substrate 100 or have an ability to trap conductive impurities.

The buffer layer 120 may be configured to cover upper portions of the data line DL and the power line VL of the first line part 110b, the first and second connection lines of the second line part 110a, the fourth electrode 110c, and the third metal layer 110d. The interlayer insulation layer 125 may be provided on the buffer layer 120, and the interlayer insulation layer 125 may cover the semiconductor layer 122.

The buffer layer 120 and the interlayer insulation layer 125 may be, but not limited to, any one of a silicon oxide film, a silicon nitride film, and a silicon oxynitride film. For example, at least any one of the buffer layer 120 and the interlayer insulation layer 125 may be provided as a plurality of layers. In case that the layer is provided as a plurality of layers, the plurality of layers may each include an oxide or nitride film including a material such as metal in addition to silicon.

The third electrode 130, the pad electrode 130b, the gate electrode 134, the source electrode 132, and the drain electrode 133 may be provided on the interlayer insulation layer 125. The third electrode 130, the pad electrode 130b, the gate electrode 134, the source electrode 132, and the drain electrode 133 may include metal such as copper, molybdenum, aluminum, chromium, and titanium that have high conductivity. For example, the third electrode 130, the pad electrode 130b, the gate electrode 134, the source electrode 132, and the drain electrode 133 may be provided together by the same process, but the present specification is not limited thereto.

The protective layer 135 and the planarization layer 140 are sequentially provided while covering the third electrode 130, the pad electrode 130b, the gate electrode 134, the source electrode 132, and the drain electrode 133. The protective layer 135 may be an inorganic insulating film, and the planarization layer 140 may be an organic insulating film. However, the present specification is not limited thereto. For example, the protective layer 135 may be excluded.

After the planarization layer 140 is provided, the trench T may be defined by a process of selectively removing the planarization layer 140 and the protective layer 135. The first trench T1 may be provided by further removing the protective layer 135 in addition to the planarization layer 140 so that the third electrode 130 is exposed. A second trench T2 may be provided by removing the planarization layer 140 and the protective layer 135 so that the pad electrode 130b (including the data pad electrode DPD and the power voltage pad electrode VSPD) is exposed. In case that the protective layer 135 is excluded, only the planarization layer 140 may be selectively etched. The first trench T1 and the second trench T2 are provided together by a process of forming a first contact hole CT1 to connect the first electrode 150 and the drain electrode 133 of the thin-film transistor TFT. A region of the first trench T1 may be a second contact hole CT2, and a region of the second trench T2 may be a third contact hole CT3.

The first electrode 150, which is connected to the drain electrode 133 in the first contact hole CT1, may be provided by depositing an electrode material on the entire surface of the planarization layer 140 including the first contact hole CT1, the second contact hole CT2, and the third contact hole CT3 and selectively removing the electrode material. In the same way, a first upper metal layer (or a first auxiliary electrode) 150a and the second upper metal layer (or a second auxiliary electrode) 150b may be respectively provided in the second contact hole CT2 and the third contact hole CT3. However, the present specification is not limited thereto. For example, the first electrode 150, the first upper metal layer 150a, and the second upper metal layer 150b may be provided together by the same process. The first upper metal layer 150a may be excluded from the second contact hole CT2.

According to the embodiment of the present specification, the display device 1000 may include the opposing substrate 200 disposed to be opposite to the substrate 100. The display device 1000 may further include a bonding layer 180 disposed between the opposing substrate 200 and the substrate 100 having the light-emitting element ED. The bonding layer 180 may compensate for a level difference of the array provided on the substrate 100 to ensure uniform bonding between the two substrates 100 and 200. The inside of the first trench T1 may be filled with the bonding layer 180. The bonding layer 180 may serve to seal the light-emitting element ED and include an insulating material having a function of suppressing moisture permeation in addition to a bonding material. However, the present specification is not limited thereto.

The substrate 100 and the opposing substrate 200 may each include any one of a glass substrate, a plastic film, and a metal substrate. Based on the light-emitting direction, any one of the substrate 100 and the opposing substrate 200 may be transparent, and the other of the substrate 100 and the opposing substrate 200 may be opaque. However, the present specification is not limited thereto.

In the display device 1000 according to the embodiment of the present specification, the connection part CTS having a line shape parallel to one side of the substrate 100 may traverse the second line part 110a. In the connection part CTS, the third electrode 130 may be electrically connected to the second electrode 160. Therefore, a distance between the pad part PAD and the connection part CTS may be decreased regardless of a shape of the second line part 110a. For example, a straight distance of the space LK between the pad part PAD and the first line part 110b may decrease.

In addition, the second electrode 160, the third electrode 130, and the fourth electrode 110c may be connected to one another through the first trench T1 defined in the planarization layer 140. The planarization layer 140 is divided by the linear first trench T1, which makes it possible to inhibit outside air or moisture permeation at the outer periphery from affecting the inside of the display area AA.

The third electrode 130, the first upper metal layer 150a, and the second electrode 160 may be connected in the first trench T1. The fourth electrode 110c connected to the power voltage pad electrode VSPD may be connected to the third electrode 130 at the lower side of the first trench T1. For example, the plurality of metal layers is stacked at the portions where the electrodes are connected, which makes it possible to improve conductivity and reduce resistance at the time of supplying the power voltage to the second electrode 160.

Figure 6:
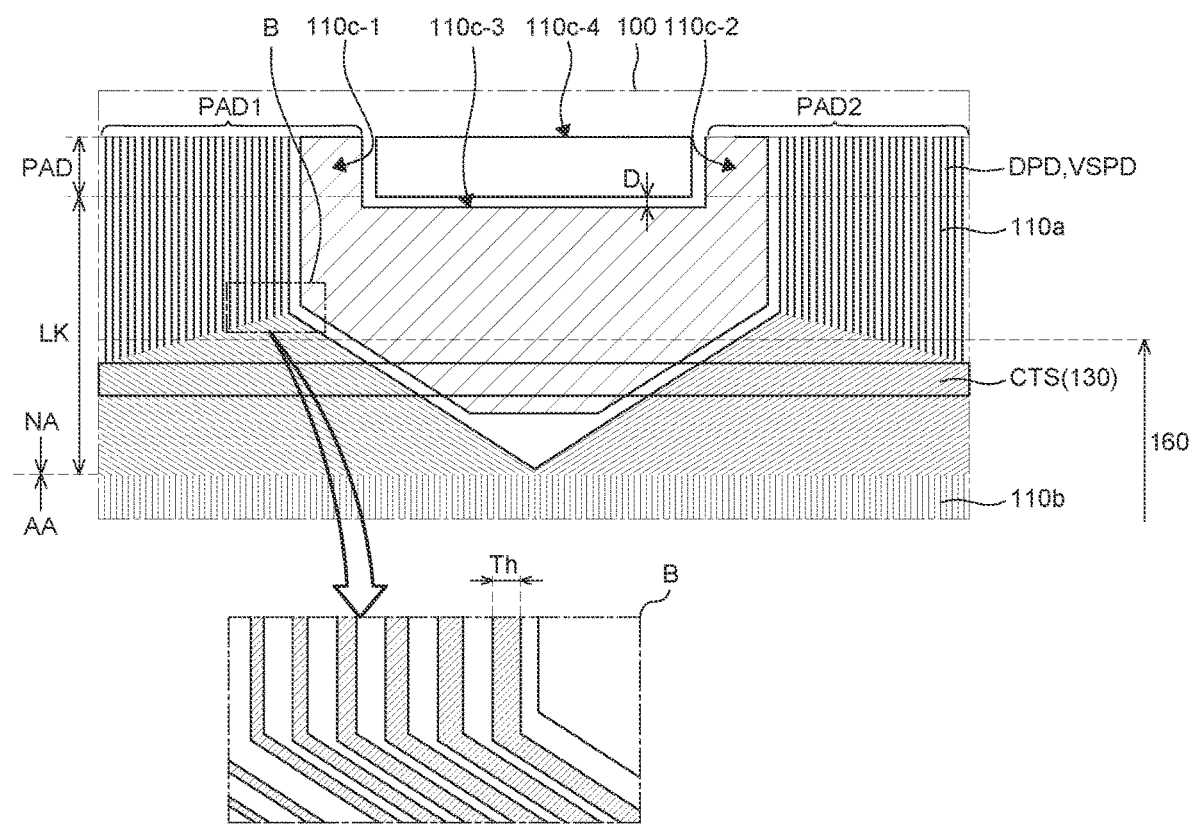
FIG. 6 is an enlarged view illustrating region X in FIG. 1 according to another embodiment of the present specification.

FIG. 6 is an enlarged view illustrating region X in FIG. 1 according to another embodiment of the present specification. Because the description of the constituent elements illustrated in FIG. 6 is substantially identical to the description of the constituent elements illustrated in FIG. 3, the description of the constituent elements illustrated in FIG. 6 will be omitted or briefly described.

With reference to FIG. 6, region X may include a region of the second line part 110a, a region of the pad part PAD, and a partial region of the first line part 110b.

In the display device 1000 according to the embodiment of the present specification, the fourth electrode 110c, the third electrode 130, and the second electrode 160 are connected, and the power voltage is applied to the fourth electrode 110c, the third electrode 130, and the second electrode 160 through the linear connection part CTS. Therefore, it is possible to reduce the bezel and suppress the concentration of density of electric current flowing in the direction from the second electrode 160 to the fourth electrode 110c and the printed circuit film 250, such that the electric current may flow uniformly.

Hereinafter, there will be described a structure capable of improving heat dissipation performance and further reducing concentration of density of electric current flowing in the direction from the second electrode 160 to the fourth electrode 110c and the printed circuit film 250. Therefore, it is possible to provide the display device 1000 capable of minimizing deterioration in reliability caused by heat generated from the pad part PAD.

The fourth electrode 110c may be disposed in the space between the sub-pad parts PADn and the space LK in which the second line part 110a is not provided between the pad part PAD and the first line part 110b. The fourth electrode 110c may include the body portion 110c-3 disposed in the second line part 110a, the first protruding portion 110c-1 disposed at one side of the body portion 110c-3 and protruding in the direction of the pad part PAD, and the second protruding portion 110c-2 disposed at the other side, which is different from one side of the body portion 110c-3, and protruding in the direction of the pad part PAD.

A width of the body portion 110c-3 may decrease in the direction from the non-display area NA to the display area AA. The body portion 110c-3 may have, but not limited to, a triangular or pentagonal shape.

The first protruding portion 110c-1 and the second protruding portion 110c-2 may be provided at one side of an outer peripheral line of the body portion and protrude to be symmetric with respect to each other in the direction of the pad part PAD. The first protruding portion 110c-1 and the second protruding portion 110c-2 may be included in the different sub-pad parts PADn. The first protruding portion 110c-1 and the second protruding portion 110c-2 may each be the outermost peripheral power voltage pad electrode VSPD of the sub-pad part PADn.

The common power voltage EVSS of the printed circuit film 250 may be applied to the second electrode 160 through the first protruding portion 110c-1 and the second protruding portion 110c-2 of the fourth electrode 110c. The electric current from the second electrode 160 may flow to the printed circuit film 250.

The density of the electric current flowing from the second electrode 160 to the printed circuit film 250 may depend on the widths of the first protruding portion 110c-1 and the second protruding portion 110c-2. For example, the density of the electric current flowing through each of the protruding portions may decrease as the width of each of the protruding portions increases. The density of the electric current flowing through each of the protruding portions may increase as the width of each of the protruding portions decreases. The width of each of the protruding portions may coincide with connection spaces at left and right outermost sides of each of the sub-pad parts PADn. For example, outermost left and right lines of each of the sub-pad parts PADn may coincide with lateral lines of each of the protruding portions. Therefore, it is possible to reduce heat generated from the pad part PAD by reducing density of the electric current passing through the protruding portion.

A metal pattern 110c-4 may be disposed in a space defined by a height of the pad part PAD and a distance between the first protruding portion 110c-1 and the second protruding portion 110c-2 of the fourth electrode 110c. The metal pattern 110c-4 may have, but not limited to, a quadrangular shape.

In the non-display area NA, the metal pattern 110c-4 may be spaced apart from or connected to the first protruding portion 110c-1 or the second protruding portion 110c-2 at two opposite sides. For example, in case that no separate constituent element is disposed between the metal pattern 110c-4 and the first protruding portion 110c-1 or the second protruding portion 110c-2 at the two opposite sides, the metal pattern 110c-4, the first protruding portion 110c-1, and the second protruding portion 110c-2 may be connected to one another. Therefore, the power voltage pad electrodes VSPD of the sub-pad parts PADn are connected in parallel, such that the density of the electric current may decrease, and the heat generated from the pad part PAD may decrease.

The metal pattern 110c-4 may be spaced apart from or connected to the body portion 110c-3 of the fourth electrode 110c. For example, in case that no separate constituent element is disposed between the metal pattern 110c-4 and the body portion 110c-3 of the fourth electrode 110c, the metal pattern 110c-4 and the body portion 110c-3 of the fourth electrode 110c may be connected to each other. Therefore, a heat dissipation area increases, such that the heat generated from the pad part PAD may decrease.

The metal pattern 110c-4 may be made of the same material as the fourth electrode 110c. However, the present specification is not limited thereto. For example, in case that the metal pattern 110c-4 is not connected to the fourth electrode 110c, the metal pattern 110c-4 may be made of a material having higher heat dissipation performance than the material of the fourth electrode 110c.

The second line part 110a of the non-display area NA may include the first connection line configured to connect the plurality of data pad electrodes DPD and the data line DL of the first line part 110b, and the second connection line configured to connect the plurality of power voltage pad electrodes VSPD and the power line VL of the first line part 110b.

Because the interval between the data lines DL and the interval between the power lines VL is different from the interval between the data pad electrodes DPD and the interval between the power voltage pad electrodes VSPD, the length of the first connection line and the length of the second connection line may be different from each other. Therefore, the connection lines may have different resistance values. As the length of the connection line increases, the resistance value may increase, and the heat generation may increase. For example, heat generated from the second connection line to which the power voltage higher than the data voltage is applied may increase.

With reference to region B in FIG. 6, widths Th of the second connection lines according to the embodiment of the present specification may be different from one another. For example, the widths Th of the second connection lines may be different from one another as the second connection lines become closer to the fourth electrode 110c. For example, the widths Th of the second connection lines may increase as the second connection lines become closer to the fourth electrode 110c. Therefore, the resistance of the second connection line may decrease, the heat dissipation area may increase, and the heat dissipation performance may be improved.

Table 1 shows a result of measuring a temperature of the fourth electrode 110c in region B of the display device 1000 according to another embodiment of the present specification and a temperature of the second connection line closest to the fourth electrode 110c. In Table 1, the columns indicate temperature measurement positions, and the rows indicate that structures for improving heat dissipation performance of the pad part are accumulated from left to right.

TABLE 1

| Classification (unit: ° C.) | Basic structure | Protruding portion with increased width | Added metal pattern | Connection line with increased width |
|---|---|---|---|---|
| Fourth electrode | 72.0 | 68.1 | 66.7 | 61.6 |
| Second connection line | 61.3 | 60.8 | 60.6 | 53.4 |

It can be seen that in the basic structure in which the structure for improving heat dissipation performance of the pad part PAD is not adopted, a temperature of the fourth electrode 110c is 72.0° C., and a temperature of the second connection line is 61.3° C., but the temperature decreases as the structure for improving heat dissipation performance is accumulated. In case that all the structure for increasing the width of each of the protruding portions, the structure for adding the metal pattern 110c-4, and the structure for increasing the width of the second connection line are accumulated, the temperature of the fourth electrode 110c is 61.6° C., and the temperature of the second connection line decreases to 53.4° C., such that it is possible to obtain an effect of improving heat dissipation performance by 14.4% and 12.9%.

According to the embodiment of the present specification, the density of the electric current of the corresponding region is reduced by changing the area and shape of the power voltage pad of the display device, such that the heat generation may be reduced. Further, the metal pattern is disposed on the power voltage pad part, and the widths of the plurality of power lines are different from one another, such that the area at the periphery of the heat generation region may be increased, and the reliability related to heat generation may be improved.

The exemplary embodiments of the present disclosure can also be described as follows:

According to an aspect of the present disclosure, there is provided a display device. The display device comprises a substrate comprising a display area in which a plurality of subpixels is disposed, and a non-display area disposed at the periphery of the display area; a pad part disposed at one side of the non-display area and comprising a plurality of data pad electrodes and a plurality of power voltage pad electrodes; a first line part disposed in the display area and comprising a plurality of data lines and a plurality of power lines; a second line part comprising, in the non-display area, a plurality of first connection lines connecting the plurality of data pad electrodes and the plurality of data lines, and a plurality of second connection lines connecting the plurality of power voltage pad electrodes and the plurality of power lines; a third electrode configured to traverse the second line part and be parallel with one side of the substrate; a planarization layer having a first trench to expose the third electrode; a second electrode connected to the third electrode through the first trench; and a plurality of fourth electrodes connecting the third electrode and the plurality of power voltage pad electrodes.

The plurality of fourth electrodes each may further comprise a body portion disposed in the second line part; a first protruding portion protruding from one side of the body portion in a direction of the pad part; and a second protruding portion protruding in the direction of the pad part from the other side different from one side of the body portion.

The pad part may comprise a plurality of sub-pad parts disposed to be spaced apart from one another. An interval between the plurality of sub-pad parts may be larger than a distance between the data pad electrodes in the pad part. The first protruding portion and the second protruding portion may be included in different sub-pad parts.

The third electrode may be connected to the body portion of each of the plurality of fourth electrodes.

The plurality of data pad electrodes and the plurality of power voltage pad electrodes of the plurality of sub-pad parts may be connected to a printed circuit film on the substrate.

the first protruding portion and the second protruding portion each may constitute an outermost periphery power voltage pad electrode of the sub-pad part.

The display device may further comprise a metal pattern spaced apart from the first protruding portion and the second protruding portion and disposed between the first protruding portion and the second protruding portion.

The metal pattern may be disposed in the pad part.

The metal pattern may be connected to the body portion.

The subpixel may comprise a driving element comprising a plurality of thin-film transistors and a storage capacitor; and a light-emitting element comprising a first electrode, a light-emitting layer, and the second electrode. The thin-film transistor may comprise a semiconductor layer, a gate electrode, a source electrode, and a drain electrode.

The second electrode at least may extend over the entire display area and to the outside of the display area. The second electrode may be integrally formed in a region including the first trench.

The display device may further comprise a sealing part filling the first trench on the second electrode. One side of the sealing part may be disposed on the planarization layer outside the first trench.

The plurality of data pad electrodes and the plurality of power voltage pad electrodes may be provided by the same process as the source electrode or the drain electrode.

The planarization layer may further comprise a second trench expose the plurality of data pad electrodes and the plurality of power voltage pad electrodes.

The display device may further comprise auxiliary electrodes respectively disposed in the first trench and the second trench.

The auxiliary electrode may be provided by the same process as the first electrode.

Widths of the plurality of second connection lines may be different from one another.

The widths of the plurality of second connection lines may vary in a direction of the fourth electrode.

The widths of the plurality of second connection lines may increase in a direction of the fourth electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure.

What is claimed is:

1. A display device comprising:
    a substrate comprising a display area including a plurality of subpixels, and a non-display area at a periphery of the display area;
    a pad part at one side of the non-display area, the pad part comprising a plurality of data pad electrodes and a plurality of power voltage pad electrodes;
    a first line part in the display area, the first line part comprising a plurality of data lines and a plurality of power lines;
    a second line part comprising a plurality of first connection lines in the non-display area that connect the plurality of data pad electrodes and the plurality of data lines, and a plurality of second connection lines in the non-display area that connect the plurality of power voltage pad electrodes and the plurality of power lines;
    a third electrode configured to traverse the second line part and be in parallel with one side of the substrate;
    a planarization layer having a first trench that exposes the third electrode;
    a second electrode connected to the third electrode through the first trench; and
    a plurality of fourth electrodes connecting the third electrode and the plurality of power voltage pad electrodes.

2. The display device of claim 1, wherein the plurality of fourth electrodes each further comprises:
    a body portion in the second line part;
    a first protruding portion protruding from one side of the body portion in a direction of the pad part; and
    a second protruding portion protruding in the direction of the pad part from another other side different from the one side of the body portion.

3. The display device of claim 2, wherein the pad part comprises a plurality of sub-pad parts spaced apart from one another,
    wherein an interval between the plurality of sub-pad parts is greater than a distance between the plurality of data pad electrodes in the pad part, and
    wherein the first protruding portion and the second protruding portion are included in different sub-pad parts from the plurality of sub-pad parts.

4. The display device of claim 2, wherein the third electrode is connected to the body portion of each of the plurality of fourth electrodes.

5. The display device of claim 3, wherein the plurality of data pad electrodes and the plurality of power voltage pad electrodes of the plurality of sub-pad parts are connected to a printed circuit film on the substrate.

6. The display device of claim 3, wherein the first protruding portion and the second protruding portion each constitute an outermost periphery power voltage pad electrode of a sub-pad part.

7. The display device of claim 3, further comprising:
    a metal pattern spaced apart from the first protruding portion and the second protruding portion and between the first protruding portion and the second protruding portion.

8. The display device of claim 7, wherein the metal pattern is in the pad part.

9. The display device of claim 7, wherein the metal pattern is connected to the body portion.

10. The display device of claim 1, wherein a subpixel from the plurality of subpixels comprises:
   a driving element comprising a plurality of thin-film transistors and a storage capacitor, and
   a light-emitting element comprising a first electrode, a light-emitting layer, and the second electrode, and
   wherein a thin-film transistor of the plurality of thin-film transistors comprises a semiconductor layer, a gate electrode, a source electrode, and a drain electrode.

11. The display device of claim 10, wherein the second electrode at least extends over the display area in its entirety and to outside of the display area, and
   wherein the second electrode is integrally formed in a region including the first trench.

12. The display device of claim 11, further comprising:
   a sealing part filling the first trench on the second electrode,
   wherein one side of the sealing part is on the planarization layer outside the first trench.

13. The display device of claim 10, wherein the plurality of data pad electrodes and the plurality of power voltage pad electrodes are provided in a same layer and made of a same material as the source electrode or the drain electrode.

14. The display device of claim 13, wherein the planarization layer further comprises a second trench that exposes the plurality of data pad electrodes and the plurality of power voltage pad electrodes.

15. The display device of claim 14, further comprising:
   auxiliary electrodes respectively disposed in the first trench and the second trench.

16. The display device of claim 15, wherein the auxiliary electrode is provided in a same layer and made of a same material as the first electrode.

17. The display device of claim 1, wherein widths of the plurality of second connection lines are different from one another.

18. The display device of claim 17, wherein the widths of the plurality of second connection lines vary in a direction of a fourth electrode of the plurality of fourth electrodes.

19. The display device of claim 17, wherein the widths of the plurality of second connection lines increase in a direction of a fourth electrode of the plurality of fourth electrodes.

20. The display device of claim 2, wherein a width of the body portion decreases in a direction from the non-display area to the display area.

* * * * *